June 18, 1968 W. O. NICCOLLS 3,389,263
NEON PHOTOCONDUCTOR RING OSCILLATOR CIRCUIT
Filed Sept. 24, 1965
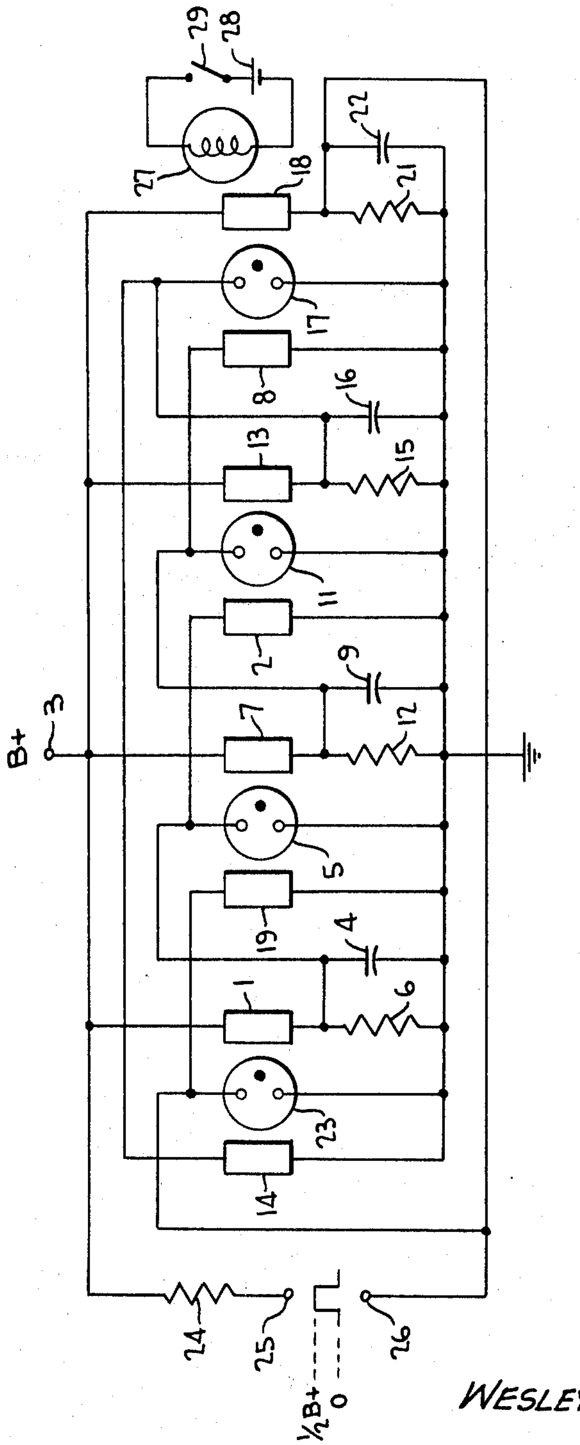
INVENTOR.
WESLEY O. NICCOLLS
BY Harry M. Saragovitz,
Edward J. Kelly,
Herbert Berl & Charles L. Whitham
ATTORNEYS United States Patent Office 3,389,263
Patented June 18, 1968

3,389,263
NEON PHOTOCONDUCTOR RING OSCILLATOR CIRCUIT
Wesley O. Niccolls, 7015 Centreville Road, Manassas, Va. 22110
Filed Sept. 24, 1965, Ser. No. 490,142
3 Claims. (Cl. 250—209)

ABSTRACT OF THE DISCLOSURE

A photo-electric ring oscillator circuit having a plurality of oscillator stages and with two photo-electric switches connected as a voltage divider in each stage. The first photo-electric switch is controlled by light radiation from the next preceding stage and the second, by light radiation from the next succeeding stage. Connected in shunt with the second photo-electric switch are a light source and a capacitor. When the first photo-electric switch is made to assume its low-resistance or high-conductivity state, the capacitor charges to the firing voltage of the light source. The light source extinguishes when the second photo-electric switch is made to assume its high-conductivity state.

The invention described herein may be manufactured and used by or for the Government of the United States of America for governmental purposes without the payment to me of any royalty thereon.

This invention relates generally to oscillator circuits, and more particularly to a photo-electric ring oscillator circuit.

Ring oscillator circuits have great application in many diverse fields of electronics. For example, when used as a counter, the ring oscillator can simply and reliably generate, encode or decode any desired binary code in computing and communication systems. When used in its basic function as an oscillator, the ring oscillator becomes an accurate timer for many complex systems such as automatic control and fuze systems. The ring oscillator also performs complex frequency divisions and, as a result, has considerable application in the electronic organ art.

In recent years, considerable attention has been devoted to photo-electric circuitry. There are many appealing characteristics exhibited by this type of circuitry. In particular, the photo-electric switch has the desirable features of unilateral operation, low noise, and ease of isolation. In addition, photo-electric circuits are simpler, more dependable, and cheaper to manufacture than their vacuum tube or transistor counterparts. Further, when used in counter and timing circuits, visible readout is provided without additional components or elements.

It is therefore an object of the present invention to provide an improved ring oscillator circuit which employs photo-electric circuitry and produces highly accurate timed pulses.

It is another object of this invention to provide a photo-electric ring oscillator circuit which is inexpensive to build and produces highly accurate, low noise, dependable operation.

According to the instant invention, the foregoing and other objects are attained by providing in each stage of the ring oscillator two photo-electric switches connected as a voltage divider. The first photo-electric switch is controlled by light radiation from the next preceding stage; and the second, by light radiation from the next succeeding stage. Connected in shunt with the second photo-electric switch are a light source and a capacitor. When the first photo-electric switch is caused to assume its low-resistance or high-conductivity state, the capacitor charges to the firing voltage of the light source. The light source is thereafter caused to extinguish when the second photo-electric switch is made to assume its high-conductivity state. The value of the capacitor accurately determines the firing time of the light source within a stage and thereby the extinguishing time of a light source in the next preceding stage.

The specific nature of the invention, as well as other objects, uses and advantages thereof, will clearly appear from the following description and from the accompanying drawing, in which:

The sole figure is a schematic diagram which illustrates the photo-electric ring oscillator according to the invention.

Referring now to the drawings, there is shown a first photoconductive cell 1 and a second photoconductive cell 2 connected as a voltage divider between a source of positive voltage (B+) connected to terminal 3 and ground. Connected in shunt with photoconductive cell 2 are a capacitor 4 and a light source 5. The photoconductive cells may be, for example, cadmium selenide cells, and the light source may be a neon gas tube. The voltage (B+) at terminal 3 is greater than the firing voltage of light source 5 but less than twice its extinguishing voltage. The voltage divider comprising photoconductive cells 1 and 2 charge capacitor 4 to a voltage equal to ½ B+ which is less than the extinguishing voltage and, therefore, less than the firing voltage of light source 5. When light radiation from the next preceding stage causes photoconductive cell 1 to assume its high-conductivity state, capacitor 4 charges exponentially through photoconductive cell 1 until the firing voltage of light source 5 is reached. This RC time delay is controllable by the choice of the value of capacitance of capacitor 4 and uniquely provides accurately timed pulses between stages of the oscillator. The capacitor 4 may be either fixed or variable. When light source 5 fires, capacitor 4 discharges to the maintaining voltage of light source 5 which continues to glow until extinguished. Because of the high resistance of the photoconductive cells when in their low-conductivity state, it may be necessary to connect a resistor (not shown) in parallel with photoconductive cell 1 to permit light source 5 to continue to glow until extinguished. This, of course, depends on the choice of the particular photoconductive cells used and other circuit values. Photoconductive cell 2, which may be augmented by a resistor 6 to more accurately control the charging and discharging of capacitor 4, remains in its high-resistance or low-conductivity state until irradiated by light from the next succeeding stage. When thus irradiated, photoconductive cell 2 assumes its low-resistance and causes the voltage across light source 5 to drop below its extinguishing voltage.

All other stages in the ring oscillator are identical with the stage just described. Thus, the next succeeding stage comprises photoconductive cells 7 and 8 connected as a voltage divider with a capacitor 9 and a light source 11 connected in parallel with photoconductive cell 8. A resistor 12 also shunts photoconductive cell 8. The following stage comprises photoconductive cells 13 and 14 connected as a voltage divider with a resistor 15, a capacitor 16, and a light source 17 connected in parallel with photoconductive cell 14. And finally to complete the ring, the last stage comprises photoconductive cells 18 and 19 connected as a voltage divider with a resistor 21, a capacitor 22, and a light source 23 connected in parallel with photoconductive cell 19. The physical placement and isolation of the photoconductive cells in relation to the light sources is critical to the practice of the invention. More particularly, the first photoconductive cell of the voltage divider in each stage of the oscillator is juxtaposed to the light source in the next preceding stage, and the second photoconductive cell is juxtaposed to the light source in the next succeeding stage. The first photoconductive cell responds to light radiation only from the light source in the next preceding stage, being isolated from other and stray light sources. Similarly, the second photoconductive cell is isolated from all other light sources but the light source in the next succeeding stage. A suitable arrangement which provides the desired isolation in a compact assembly is illustrated in FIGURE 2 of Patent No. 3,070,306 to DuBois for "Multiplying Circuit." Many other physical arrangements are known in the art and can, of course, be employed with equal effect.

The operation of the ring oscillator circuit may be initiated mechanically, electrically or optically. To provide for mechanical initiation, a momentary contact switch (not shown) may be placed in parallel with photoconductive cell 18, for example. When the switch is momentarily closed, capacitor 22 will charge to the firing voltage of light source 23.

For electrical initiation, there is provided resistor 24 which is connected between terminals 3 and 25. Another terminal 26 is connected to the junction of light source 23 and capacitor 22 with photoconductive cell 18. To cause light source 23 to fire, a positive pulse having an amplitude equal to one half B+ is impressed across terminals 25 and 26. This combines with the voltage across capacitor 22 which is charged to one half B+ to raise the voltage across light source 23 to be equal to B+ or greater than the firing voltage.

The alternate optical initiation employs an additional light source 27, which may be an incandescent lamp, connected in series with a battery 28 and a switch 29. Light source 27 is positioned adjacent photoconductive cell 18 and causes photoconductive cell 18 to assume its low-resistance or high-conductivity state when switch 29 is closed.

While only a four stage ring oscillator has been illustrated and described, it should be obvious to those skilled in the art that any number of stages may be cascaded as desired. Further, by using multiple photoconductive cells which are activated by a single light source in any particular stage, signals may be tapped off at any desirable point along the ring oscillator for frequency division or logic circuit purposes. This makes possible the operation of several ring oscillator circuits in parallel. Since there is no loading to a stage of the ring oscillator circuit, the limit to the number of photoconductive cells in any particular stage is determined by the physical size and sensitivity of the cells.

It will be apparent that the embodiments shown are only exemplary and that various modifications can be made in construction and arrangement within the scope of the invention as defined in the appended claims.

I claim as my invention:

1. A photo-electric ring oscillator circuit having a plurality of stages, each stage comprising:

(a) a voltage divider comprising a first photoconductive cell and a second photoconductive cell;

(b) a capacitor connected in parallel with said second photoconductive cell;

(c) a light source connected in parallel with said second photoconductive cell and said capacitor; and (d) a source of voltage having a value greater than the firing voltage but less than twice the extinguishing voltage of said light source connected across said voltage divider, said first photoconductive cell being positioned adjacent the light source in the next preceding stage and said second photoconductive cell being positioned adjacent the light source in the next succeeding stage, the value of capacitance of said capacitor being chosen to accurately determine the desired firing time of the light source within a stage and thereby the extinguishing time of the light source in the next preceding stage.

2. A photo-electric ring oscillator circuit as recited in claim 1 further comprising a resistor in each stage connected in shunt with said capacitor for more accurately determining the charging and discharging characteristics of said capacitor.

3. A photo-electric ring oscillator circuit as recited in claim 2 wherein said light source is a neon gas tube and said photoconductive cells are cadmium selenide cells.

References Cited

UNITED STATES PATENTS

| | | | |
|---|---|---|---|
| 3,160,756 | 12/1964 | Marko | 250—209 |
| 3,234,391 | 2/1966 | Te Velde | 250—209 |

RALPH G. NILSON, *Primary Examiner.*

M. ABRAMSON, *Assistant Examiner.*